United States Patent (12) United States Patent
Tsuda (10) Patent No.: US 9,166,133 B2
(45) Date of Patent: Oct. 20, 2015

(54) SUBSTRATE FOR LED, LED MODULE, AND LED BULB

(71) Applicant: Panasonic Corporation, Osaka (JP)

(72) Inventor: Kouhe Tsuda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/381,251

(22) PCT Filed: Mar. 11, 2013

(86) PCT No.: PCT/JP2013/001553
§ 371 (c)(1),
(2) Date: Aug. 27, 2014

(87) PCT Pub. No.: WO2013/136758
PCT Pub. Date: Sep. 19, 2013

(65) Prior Publication Data
US 2015/0091432 A1    Apr. 2, 2015

(30) Foreign Application Priority Data
Mar. 15, 2012 (JP) ................................ 2012-058295

(51) Int. Cl.
*H01J 1/02* (2006.01)
*H01J 7/24* (2006.01)
(Continued)

(52) U.S. Cl.
CPC .............. *H01L 33/644* (2013.01); *F21K 9/135* (2013.01); *F21K 9/1355* (2013.01);
(Continued)

(58) Field of Classification Search
CPC ... H01L 33/642; H01L 33/647; H01L 33/644; H01L 33/486; H01L 33/507; H01L 33/54; F21V 3/00; F21V 29/76; F21V 29/75; F21V 29/20; F21V 29/004; F21V 29/006; F21V 29/713; F21V 29/02; F21K 9/135; F21K 9/1355
USPC .......... 313/46, 47, 11, 33, 498, 512; 362/580, 362/294, 547, 218, 373; 257/675, 706, 712, 257/720, 796
See application file for complete search history.

(56) References Cited

U.S. PATENT DOCUMENTS 6,282,094 B1 *  8/2001  Lo et al. ........................ 361/704
7,808,013 B2 * 10/2010  Mendendorp et al. .......... 257/99
(Continued)

FOREIGN PATENT DOCUMENTS

JP    2001-243809 A    9/2001
JP    2005-209763 A    8/2005
(Continued)

OTHER PUBLICATIONS
International Search Report for PCT/JP2013/001553 mailed Apr. 9, 2013.
(Continued)

*Primary Examiner* — Thomas A Hollweg
*Assistant Examiner* — Kevin Quarterman
(74) *Attorney, Agent, or Firm* — RatnerPrestia (57) ABSTRACT

LED substrate of the present invention includes: translucent substrate body-in which an LED chip is disposed on a front face; and heat dissipation path provided in substrate body to dissipate heat generated in the LED chip. Substrate body includes a through hole that penetrates through the substrate body from the front face on which the LED chip is provided to a back face. Heat dissipation path includes: heat transfer path section provided in the through hole; and heat dissipation pattern section provided on the back face of substrate body, and connected to heat transfer path section. Thus, LED substrate having superior heat dissipation is realized.

9 Claims, 8 Drawing Sheets

(51) Int. Cl.
*H01J 61/52* (2006.01)
*H01K 1/58* (2006.01)
*H01L 33/64* (2010.01)
*H01L 25/075* (2006.01)
*F21K 99/00* (2010.01)
*H01L 33/48* (2010.01)
*H01L 33/54* (2010.01)
*H01L 33/50* (2010.01)

(52) U.S. Cl.
CPC ......... *H01L 25/0753* (2013.01); *H01L 33/486* (2013.01); *H01L 33/507* (2013.01); *H01L 33/54* (2013.01); *H01L 33/642* (2013.01); *H01L 33/505* (2013.01); *H01L 2224/48091* (2013.01); *H01L 2224/48227* (2013.01)

(56) References Cited

U.S. PATENT DOCUMENTS

| | | | |
|---|---|---|---|
| 2004/0211968 A1 | 10/2004 | Lin et al. | |
| 2005/0068776 A1* | 3/2005 | Ge | 362/296 |
| 2005/0122031 A1* | 6/2005 | Itai et al. | 313/498 |
| 2006/0163605 A1 | 7/2006 | Miyahara | |
| 2006/0183625 A1 | 8/2006 | Miyahara | |
| 2007/0023893 A1 | 2/2007 | Shin | |
| 2007/0085101 A1* | 4/2007 | Kim | 257/98 |
| 2007/0235739 A1* | 10/2007 | Sun et al. | 257/79 |
| 2008/0043444 A1* | 2/2008 | Hasegawa et al. | 361/717 |
| 2009/0114937 A1* | 5/2009 | Kawakubo | 257/98 |
| 2010/0163892 A1 | 7/2010 | Liu | |
| 2011/0003412 A1 | 1/2011 | Shin | |
| 2011/0051415 A1* | 3/2011 | Chen et al. | 362/235 |
| 2011/0133232 A1 | 6/2011 | Yoshioka et al. | |
| 2011/0156060 A1 | 6/2011 | Wang et al. | |
| 2011/0211351 A1* | 9/2011 | Van De Ven et al. | 362/249.02 |
| 2011/0220939 A1 | 9/2011 | Nakayama | |
| 2012/0307498 A1* | 12/2012 | Lo et al. | 362/249.02 |

FOREIGN PATENT DOCUMENTS

| | | |
|---|---|---|
| JP | 2007-043155 | 2/2007 |
| JP | 2007-043155 A | 2/2007 |
| JP | 2007-243809 A | 9/2007 |
| JP | 2009-117536 | 5/2009 |
| JP | 2009-117536 A | 5/2009 |
| JP | 2009-267006 A | 11/2009 |
| JP | 2009-267289 A | 11/2009 |
| JP | 2010-135718 A | 6/2010 |
| JP | 2011-119343 A | 6/2011 |
| JP | 2011-176060 | 9/2011 |
| JP | 2011-211154 A | 10/2011 |
| WO | 2005/004246 | 1/2005 |

OTHER PUBLICATIONS

The Extended European Search Report dated Mar. 5, 2015 for the related European Patent Application No. 13761834.4.

* cited by examiner

SUBSTRATE FOR LED, LED MODULE, AND LED BULB

This application is a U.S. National Phase Application of PCT International Application PCT/JP2013/001553.

TECHNICAL FIELD

The present invention relates to an LED substrate having thereon an LED (Light Emitting Diode) chip, an LED module including an LED substrate having thereon an LED chip, and an LED light bulb including an LED module.

BACKGROUND ART

In recent years, increasingly-prevailing LED light bulbs include therein LED modules in sealed globes. An LED module is configured so that an LED substrate has thereon an LED chip and the LED chip is composed of an assembly member sealed by translucent resin.

When an LED chip is supplied with electric power and emits light, the LED chip has an increased temperature due to electric power not contributing to the light emission from the LED chip. In this case, when the LED chip has insufficient heat dissipation measures, the LED chip fails or is broken. To prevent this, an LED module (LED package) having improved LED chip heat dissipation has been suggested (see for example Patent Publication 1).

Figure 9:
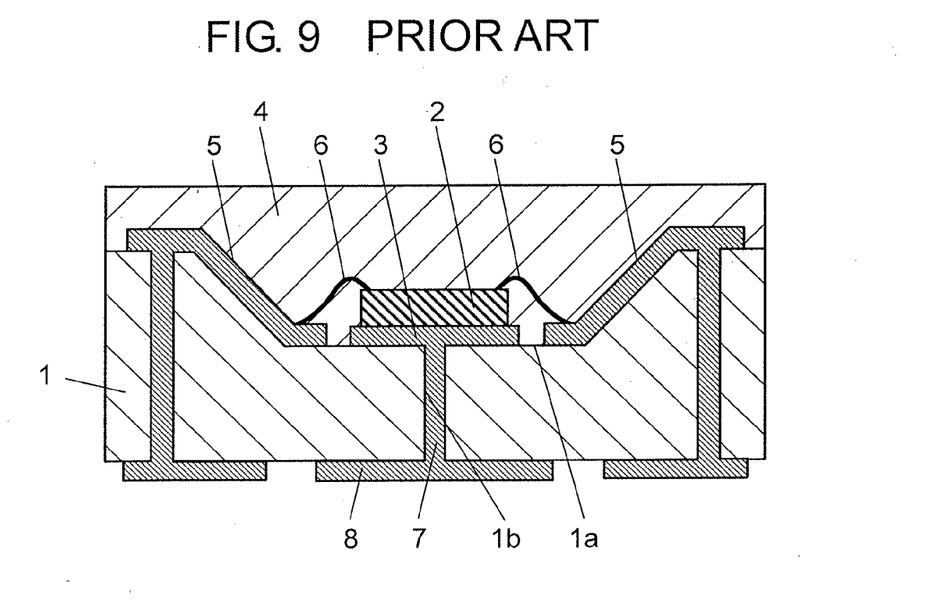
FIG. 9 is a cross-sectional front view illustrating an example of a conventional LED module.

The following section will describe an LED module disclosed in Patent Publication 1 with reference to FIG. 9. FIG. 9 is a cross-sectional front view illustrating an example of a conventional LED module.

As shown in FIG. 9, the LED module disclosed in Patent Publication 1 is configured so that one face of substrate 1 consisting of silicon or ceramic for example includes concave section 1a having a bottom section and a slope face. Concave section 1a has, at the center thereof, installation pattern 3. Installation pattern 3 has thereon LED chip 2 provided via conductive paste (not shown).

The slope face of concave section 1a has thereon wiring pattern 5. Wiring pattern 5 is connected to LED chip 2 by metal thin wire 6. LED chip 2, wiring pattern 5, and metal thin wire 6 are sealed by translucent resin 4. Resin 4 is added with fluorescent substance.

Through hole 1b is formed from the center of concave section 1a of substrate 1 to an opposite face of substrate 1. Through hole 1b has connecting section 7. Heat dissipation pattern 8 is provided at an opposite face of substrate 1 to surround through hole 1b. Heat dissipation pattern 8 and installation pattern 3 are connected via connecting section 7 provided in through hole 1b. As a result, the conventional LED module is configured so that heat generated in LED chip 2 is sequentially transmitted through conductive paste, installation pattern 3, connecting section 7, and heat dissipation pattern 8 and is dissipated to the exterior via heat dissipation pattern 8.

However, since substrate 1 of the LED module uses high-cost ceramic having superior heat dissipation, an increased cost is required for an LED light bulb including an LED module.

In order to suppress the cost increase of an LED light bulb, one approach is considered to use low-cost glass for example for substrate 1 of the LED module.

However, since glass has a low thermal conductivity, when glass is used for substrate 1 of the LED module, a disadvantage has been caused in which heat generated in LED chip 2 cannot be sufficiently dissipated.

On the other hand, even when ceramic having superior heat dissipation is used to form substrate 1 of the LED module, an increase in a light emission amount of LED chip 2 causes an increase in heat generated in LED chip 2. Thus, even the use of ceramic having superior heat dissipation may fail to provide sufficient heat dissipation of heat generated in LED chip 2.

Thus, an LED substrate, an LED module, and an LED light bulb have been conventionally desired that provide superior heat dissipation with a low cost.

PRIOR ART PUBLICATION

Patent Publication

[Patent Publication 1] Japanese Patent Unexamined Publication No. 2009-117536

SUMMARY OF THE INVENTION

In order to solve the above disadvantage, an LED substrate of the present invention includes: a translucent substrate body in which an LED chip is disposed on a front face; and a heat dissipation path provided in the substrate body to dissipate heat generated in the LED chip. The substrate body includes a through hole that penetrates through the substrate body from the front face on which the LED chip is provided to a back face. The heat dissipation path includes: a heat transfer path section provided in the through hole; and a heat dissipation pattern section provided on the back face of the substrate body, and connected to the heat transfer path section.

By this configuration, the heat generated in the LED chip can be transferred from the heat transfer path section of the heat dissipation path to the heat dissipation pattern section and can be dissipated, thus suppressing the LED chip from being excessively heated.

When a plurality of LED chips are provided, heat transfer path sections of the heat dissipation paths are provided for the respective LED chips to connect the respective heat transfer path sections to the respective heat dissipation pattern sections. As a result, the heat generated in the plurality of LED chips can be transferred from the connected heat transfer path sections to the heat dissipation pattern sections for heat dissipation. This can consequently suppress the LED chip from being excessively heated.

An LED module of the present invention includes: the LED substrate; an LED chip provided to a fluorescent substance layer of the LED substrate; and translucent resin including fluorescent substance for sealing the LED chip.

In this manner, an LED module can be realized that can suppress the LED chip from being excessively heated.

An LED light bulb of the present invention includes the LED module connected to a heat dissipation support member and enclosed in a globe.

By this configuration, an LED light bulb can be realized that has a long life and reliability.

DESCRIPTION OF EMBODIMENTS

The following section will describe an exemplary embodiment of the present invention with reference to the drawings. The invention is not limited by this exemplary embodiment.

First Exemplary Embodiment

The following section will describe an LED substrate according to a first exemplary embodiment of the present invention, an LED module having the LED substrate, and an LED light bulb including the LED substrate, and the LED module with reference to the drawings.

First, the LED substrate according to the exemplary embodiment and an LED module having the LED substrate will be described with reference to FIG. 1 to FIG. 3.

Figure 1:
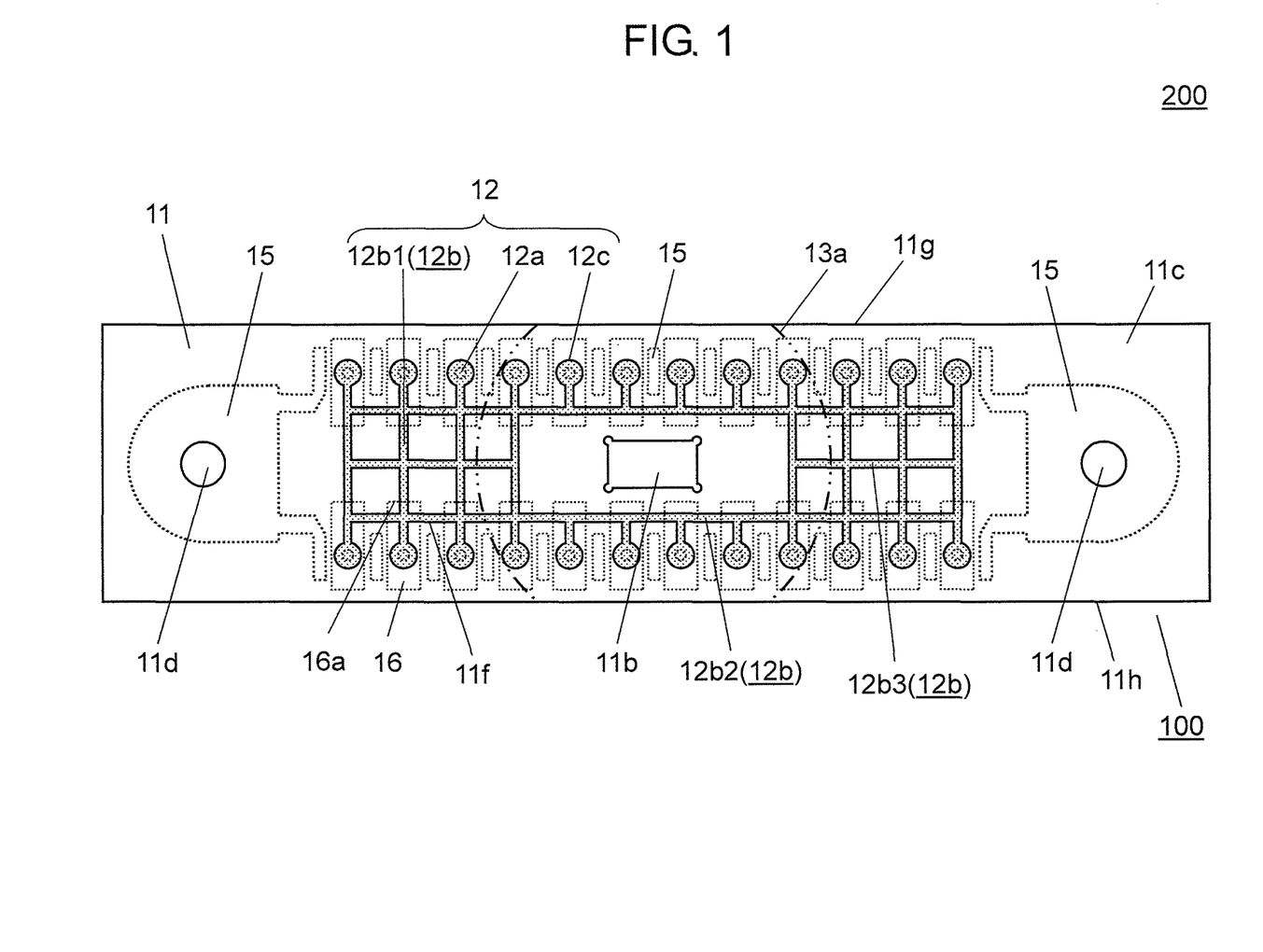
FIG. 1 is a bottom view illustrating a schematic configuration of an LED module according to a first exemplary embodiment of the present invention.

FIG. 1 is a bottom view illustrating a schematic configuration of an LED module according to a first exemplary embodiment of the present invention. FIG. 2 is a top view illustrating a schematic configuration of the LED module according to the exemplary embodiment. FIG. 3 is a partial cross-sectional view illustrating the LED module according to the exemplary embodiment.

Figure 2:
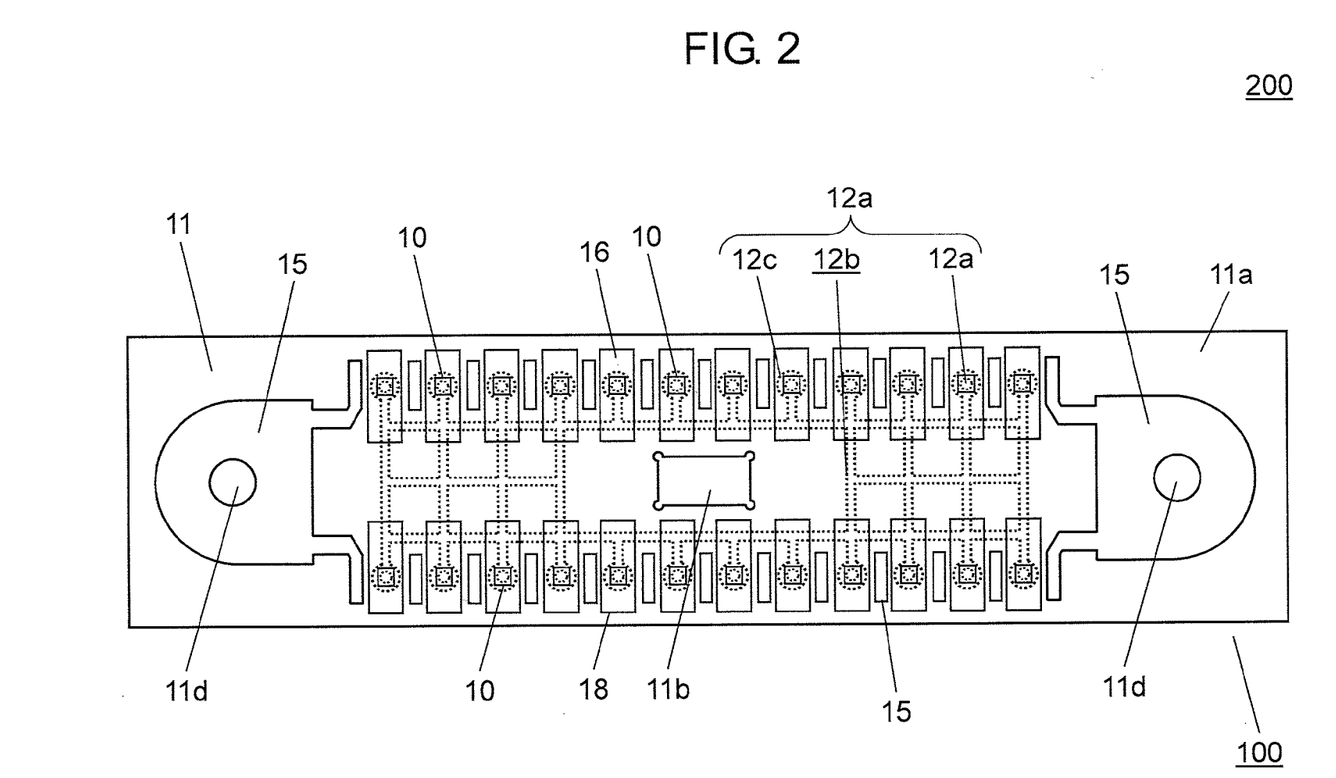
FIG. 2 is a top view illustrating the schematic configuration of the LED module according to the exemplary embodiment.

As shown in FIG. 1 and FIG. 2, LED substrate 100 of the exemplary is composed of substrate body 11 including substrate body 11 including at least engagement hole 11b and connection hole 11d; wiring section 15; and heat dissipation path 12.

Substrate body 11 has an oblong plate-like shape for example consisting of translucent glass such as borosilicate glass for example. Wiring section 15 is provided at front face 11a side of substrate body 11. Wiring sections 15 have therebetween fluorescent substance layer 16 (which will be described later) and an LED chip provided on fluorescent substance layer 16 to form a predetermined arrangement pattern.

Heat dissipation path 12 is composed of heat transfer path section 12a; heat dissipation pattern section 12b; and connecting section 12c. When substrate body 11 is made of glass for example, heat dissipation path 12 is formed by paste having a higher thermal conductivity than that of glass (e.g., copper, silver, or silver solder material).

Heat transfer path section 12a is provided to correspond to the position of a to-be-mounted LED chip. Heat transfer path section 12a is formed by injecting the paste into through hole 11e 11 penetrating from front face 11a of substrate body to back face 11c to thermally-cure the paste for example. Connecting section 12c is composed of heat dissipation pattern section 12b surrounding engagement hole 11b of substrate body 11 superimposed on tip end face 13a of heat dissipation support member 13 (which will be described later).

When LED chips 10 are disposed, heat dissipation pattern sections 12b for connecting heat transfer path sections 12a are formed, as will be described in detail in the following section, to form a grid-like or ladder-like pattern for example while bypassing engagement hole 11b. This can consequently develop heat dissipation pattern section 12b so as not to hinder the light emission from a back face of LED chip 10.

Specifically, as shown in FIG. 1, heat dissipation pattern section 12b is configured by developing short side line 12b1, long side line 12b2, and centerline 12b3 so as to connect, at back face 11c side of substrate body 11, heat transfer path section 12a at one side edge 11g side of substrate body 11 to heat transfer path section 12a the other side edge 11h side.

Short side line 12b1 is introduced from short side section 16a of fluorescent substance layer 16 to connect substrate body 11 at both side edges 11g and 11h sides. Short side line 12b1 in the vicinity of the center of substrate body 11 is connected to long side line 12b2 and is not connected to short side line 12b1 at an opposite side. Long side line 12b2 connects short side line 12b1 along side edges 11g and 11h of substrate body 11. Centerline 12b3 connects short side lines 12b1 at the centerline for example to avoid the neighborhood of the center of substrate body 11 and both ends thereof.

A part of heat dissipation pattern section 12b of heat dissipation path 12 is provided to be opposed to fluorescent substance layer 16 via substrate body 11. Thus, a part of opposed heat dissipation pattern section 12b partially blocks the light emitted to back face 11c side of substrate body 11 via fluorescent substance layer 16. Thus, the area of fluorescent substance layer 16 blocked by heat dissipation pattern section 12b is preferably set to be 75% or less for example of the area of fluorescent substance layer 16. This can provide efficient light emission to back face 11c side of substrate body 11.

Similarly, in the vicinity of engagement hole 11b at the center of substrate body 11 superimposed on tip end face 13a of heat dissipation support member 13 (which will be described with reference to FIG. 4A and FIG. 4B), heat dissipation support member 13 blocks the light emitted from LED chip 10 to back face 10a. Thus, heat dissipation pattern section 12b at the center of substrate body 11 may be provided on the entire face to be opposed fluorescent substance layer 16 on the entire face.

Heat dissipation pattern section 12b of the exemplary embodiment is provided by forming groove 11f (see FIG. 3) in back face 11c of substrate body 11 by sandblasting for example to fill formed groove 11f with material such as copper, silver, or silver solder material. As a result, heat dissipation pattern section 12b can be more closely attached to substrate body 11 of LED substrate 100, thus providing improved reliability. Furthermore, when compared with a case where heat dissipation pattern section 12b is formed to have a thin thickness on back face 11c of substrate body 11, heat dissipation pattern section 12b can have an increased cross-sectional area, thus providing further-improved heat dissipation.

In the manner as described above, heat dissipation pattern section 12b of the exemplary embodiment is configured.

As shown in FIG. 1 and FIG. 2, engagement hole 11b of substrate body 11 is formed in the vicinity of the center of substrate body 11 and receives projection 13b (see FIG. 4B) provided on tip end face 13a of heat dissipation support member 13 (heat sink) to fix heat dissipation support member 13.

Connection holes 11*d* of substrate body 11 are provided in wiring sections 15 at both ends of substrate body 11 and are connected to a pair of lead wires 14 (see FIG. 5) provided in LED light bulb 300.

As shown in FIG. 2, wiring section 15 provided at front face 11*a* side of substrate body 11 is formed by silver paste for example. Wiring section 15 is provided, for example, between a part including connection hole 11*d* and LED chip 10 in a part along both side edges 11*g* and 11*h* of substrate body 11. Wiring sections 15 along both side edges 11*g* and 11*h* of substrate body 11 are provided discretely and discontinuously with an equal interval.

In the manner as described above, LED substrate 100 of the exemplary embodiment is configured.

Figure 3:
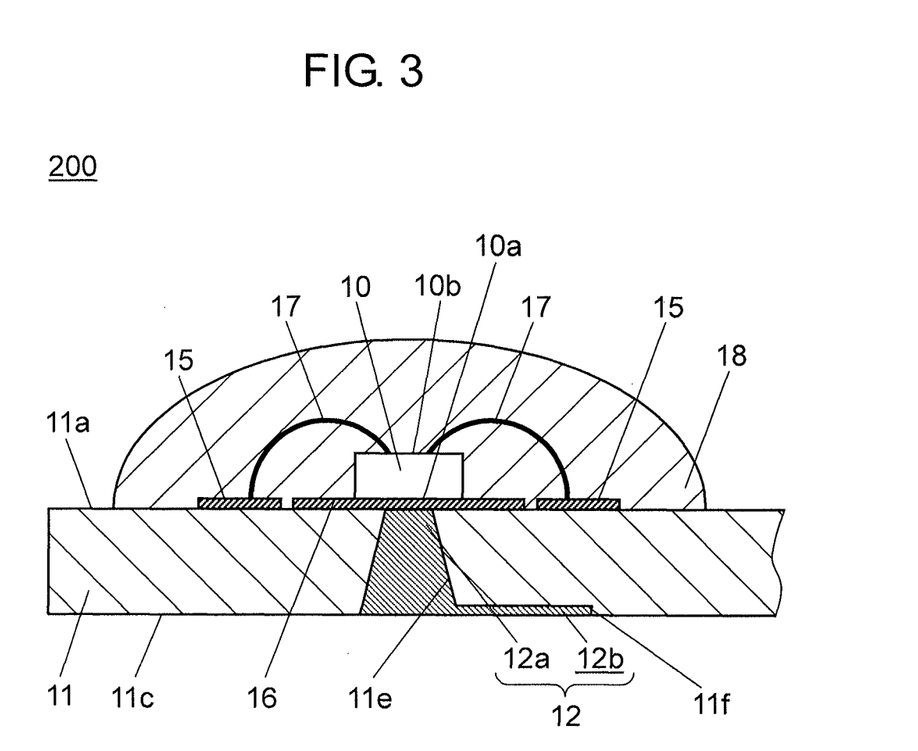
FIG. 3 is a cross-sectional view illustrating the LED module according to the exemplary embodiment.

The following section will describe the LED module of the exemplary embodiment with reference to FIG. 1 and FIG. 2 and using FIG. 3.

FIG. 3 is a cross-sectional front view illustrating the LED module according to the exemplary embodiment.

As shown in FIG. 3, LED module 200 of the exemplary embodiment is composed of fluorescent substance layer 16 provided at least at front face 11*a* side of LED substrate 100, LED chip 10 provided on fluorescent substance layer 16, and translucent resin 18 including at least fluorescent substance for sealing the LED chip. LED chip 10 and wiring section 15 are connected by metal thin wire 17 such as gold for example. Translucent resin 18 is preferably sealed for each column in consideration of productivity for example without sealing each LED chip 10. However, LED chip 10 also may be individually sealed.

LED chip 10 is provided on fluorescent substance layer 16 and has a square shape when seen in a top view. LED chip 10 is provided between wiring sections 15 provided in front face 11*a* of substrate body 11 shown in FIG. 2. FIG. 2 illustrates an example in which LED chips 10 are provided along two parallel columns along both side edges 11*g* and 11*h* of substrate body 11. However, the invention is not limited to this. For example, LED chips 10 also may be provided in one column or three or more columns for example. The number of LED chips 10 included in one column is not limited to the example shown in FIG. 2.

Fluorescent substance layer 16 converts the light emitted from back face 10*a* side of LED chip 10 to have a predetermined color. Then, the converted light is emitted from back face 11*c* of substrate body 11. Fluorescent substance layer 16 is preferably formed to have an oblong shape larger than the outer shape of LED chip 10. Similarly, translucent resin 18 converts the light emitted from surface 10*b* side of LED chip 10 to have a predetermined color. Then, the converted light is emitted from translucent resin 18. By doing this, the light emitted from LED chip 10 can be used effectively and light can be emitted in a wide range from the up-and-down direction of the LED module.

As shown in FIG. 3, a position at which LED chip 10 of substrate body 11 is provided has through hole 11*e* formed to extend from front face 11*a* of substrate body 11 to back face 11*c*. Through hole 11*e* is formed to have a funnel shape by a low-cost sandblasting for example so that front face 11*a* side of substrate body 11 has a smaller diameter and back face 11*c* side has a larger diameter.

By filling through hole 11*e* with paste material such as copper, silver, or silver solder material for example, frustum-shaped heat transfer path section 12*a* of heat dissipation path 12 is formed. By forming heat transfer path section 12*a* to have a frustum shape, when compared with cylindrical heat transfer path section 12*a*, heat transfer path section 12*a* and substrate body 11 can have therebetween an increased contact area and heat transfer path section 12*a* can be inserted in a wedge-like manner. As a result, heat dissipation can be increased and heat transfer path section 12*a* can be closely attached to substrate body 11, thereby providing improved reliability. Although through hole 11*e* has been illustratively described as having a funnel shape of a frustum shape, the invention is not limited to this. For example, through hole 11*e* may be formed to have a taper shape of a truncated pyramid shape.

In the manner as described above, LED module 200 of the exemplary embodiment is configured.

The following section will describe the LED light bulb of the exemplary embodiment with reference to the drawings.

Figure 4A:
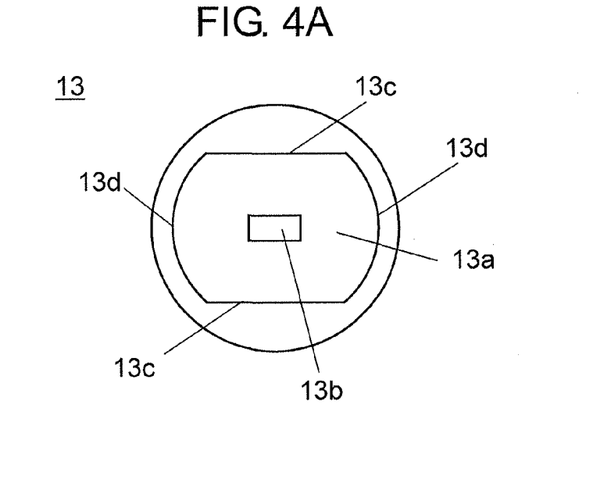
FIG. 4A is a top view illustrating an example of a heat dissipation support member constituting a LED light bulb according to the exemplary embodiment.
Figure 4B:
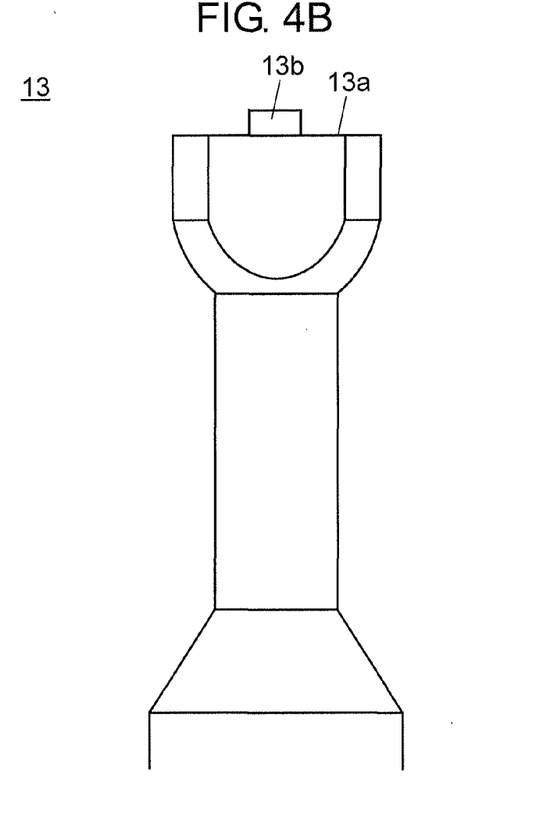
FIG. 4B is a front view illustrating an example of the heat dissipation support member constituting the LED light bulb according to the exemplary embodiment.

First, the following section will describe heat dissipation support member 13 for supporting LED module 200 included in LED light bulb 300 using FIG. 4A and FIG. 4B.

FIG. 4A is a top view illustrating an example of a heat dissipation support member constituting an LED light bulb according to the exemplary embodiment. FIG. 4B is a front view illustrating an example of the heat dissipation support member constituting an LED light bulb according to the exemplary embodiment As shown in FIG. 4A and FIG. 4B, both side edges 13*c* of tip end face 13*a* of heat dissipation support member 13 are formed by two parallel straight lines having the same width as that of substrate body 11. Both ends 13*d* of tip end face 13*a* have a so-called oval shape formed by a circular arc shape. Tip end face 13*a* of heat dissipation support member 13 has projection 13*b* engaged with engagement hole 11*b* of substrate body 11 of LED substrate 100. Heat dissipation support member 13 is preferably formed, for example, by material having a higher thermal conductivity than that of substrate body 11 or heat dissipation path 12 (e.g., aluminum alloy). This can consequently improve the heat transfer to heat dissipation support member 13, thereby effectively providing improved heat dissipation. However, heat dissipation support member 13 does not always have to have a thermal conductivity higher than that of the material of heat dissipation path 12.

By inserting projection 13*b* of heat dissipation support member 13 to engagement hole 11*b* of substrate body 11, projection 13*b* is imposed on the center of back face 11*c* of substrate body 11 to support LED substrate 100 constituting LED module 200. Then, tip end face 13*a* of heat dissipation support member 13 is connected and superimposed with heat dissipation pattern section 12*b* of heat dissipation path 12 at the center of heat dissipation path 12 (i.e., connecting section 12*c*).

By the configuration as described above, heat dissipation support member 13 for supporting LED module 200 is formed and is accommodated in globe 19 constituting LED light bulb 300.

Figure 5:
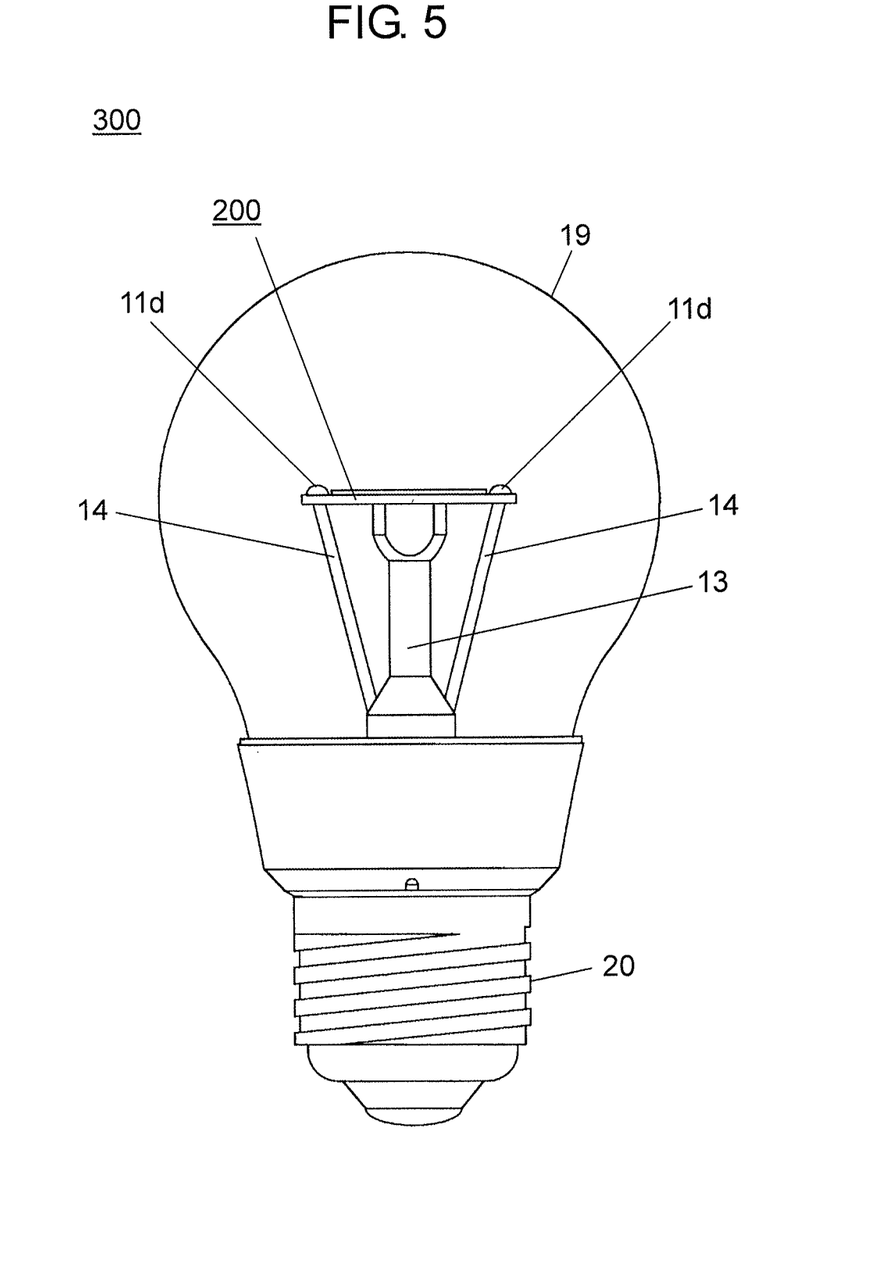
FIG. 5 is a front view illustrating an example of the LED light bulb according to the exemplary embodiment.

Next, the following section will describe LED light bulb of the exemplary embodiment using FIG. 5.

FIG. 5 is a front view illustrating an example of LED light bulb of the exemplary embodiment.

As shown in FIG. 5, LED light bulb 300 of the exemplary embodiment is configured so that LED module 200 supported by heat dissipation support member 13 is accommodated in globe 19 in which a base end is integrated with bayonet cap 20. Then, a base end of heat dissipation support member 13 is fixed to base (not shown) in bayonet cap 20. Tip ends of lead wires 14 introduced from the base is connected to connection hole 11*d* of LED substrate 100 constituting LED module 200. Thus, power is conducted from lead wires 14 to LED chip 10 through connection hole 11*d* of LED substrate 100, wiring section 15, and metal thin wire 17.

Upon receiving power, LED chip 10 emits light from front face 10b and back face 10a. The light emitted from LED chip 10 is converted by fluorescent substance included in translucent resin 18 and fluorescent substance layer 16 to have a predetermined color and then the resultant light is emitted from substantially the entire face (including the entire face) of globe 19. A part at which tip end face 13a of heat dissipation support member 13 is superimposed with back face 11c of substrate body 11 blocks the light emitted from the back face of LED chip 10. However, this has little influence on the light emitted from the entirety of LED light bulb 300 and thus is not disadvantageous.

Then, LED chip 10 generally generates heat due to light emission.

However, according to the exemplary embodiment, the generated heat is transferred from heat transfer path section 12a of heat dissipation path 12 to heat dissipation pattern section 12b and is dissipated through heat dissipation pattern section 12b. The generated heat is also transferred to heat dissipation support member 13 connected to connecting section 12c of heat dissipation pattern section 12b and is dissipated through heat dissipation support member 13. Thus, the heat generated due to light emission is prevented from being accumulated in LED chip 10.

The light emitted from back face 10a of LED chip 10 passes through fluorescent substance layer 16 and is emitted while a part of the light being blocked by heat dissipation pattern section 12b of heat dissipation path 12. However, according to the exemplary embodiment, the area at which heat dissipation pattern section 12b provided in LED substrate 100 is superimposed with fluorescent substance layer 16 is 75% or less of the area of fluorescent substance layer 16, thus preventing the light emission from LED light bulb 300 from being prevented.

As described above, according to the LED light bulb of the exemplary embodiment, heat dissipation path 12 can be used to efficiently dissipate the heat generated from LED chip 10 without causing LED chip 10 from having a deteriorated light emission performance. Thus, LED chip 10 can be prevented from being excessively heated, thus obviating failure or breakage. As a result, an LED light bulb can be realized that has a long life and high reliability.

Second Exemplary Embodiment

Figure 6:
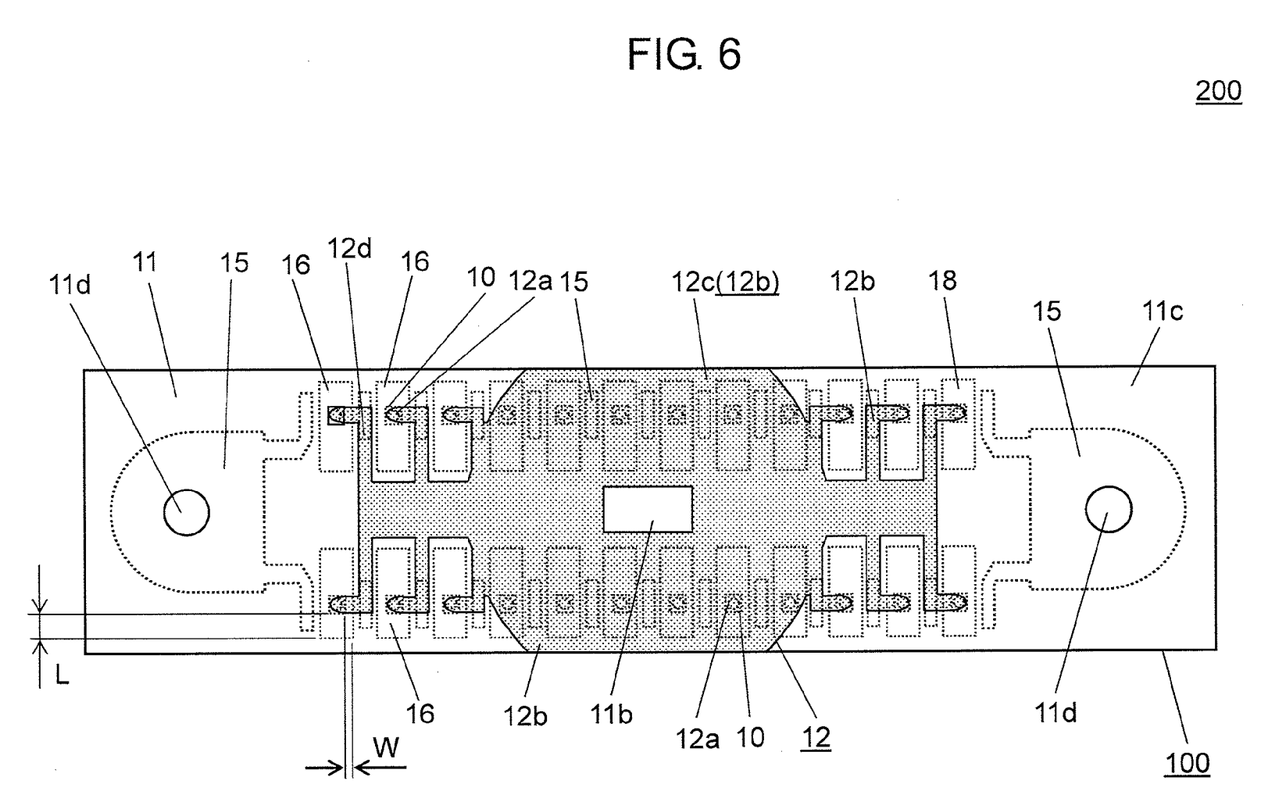
FIG. 6 is a bottom view illustrating a schematic configuration of an LED module according to a second exemplary embodiment of the present invention.
Figure 7:
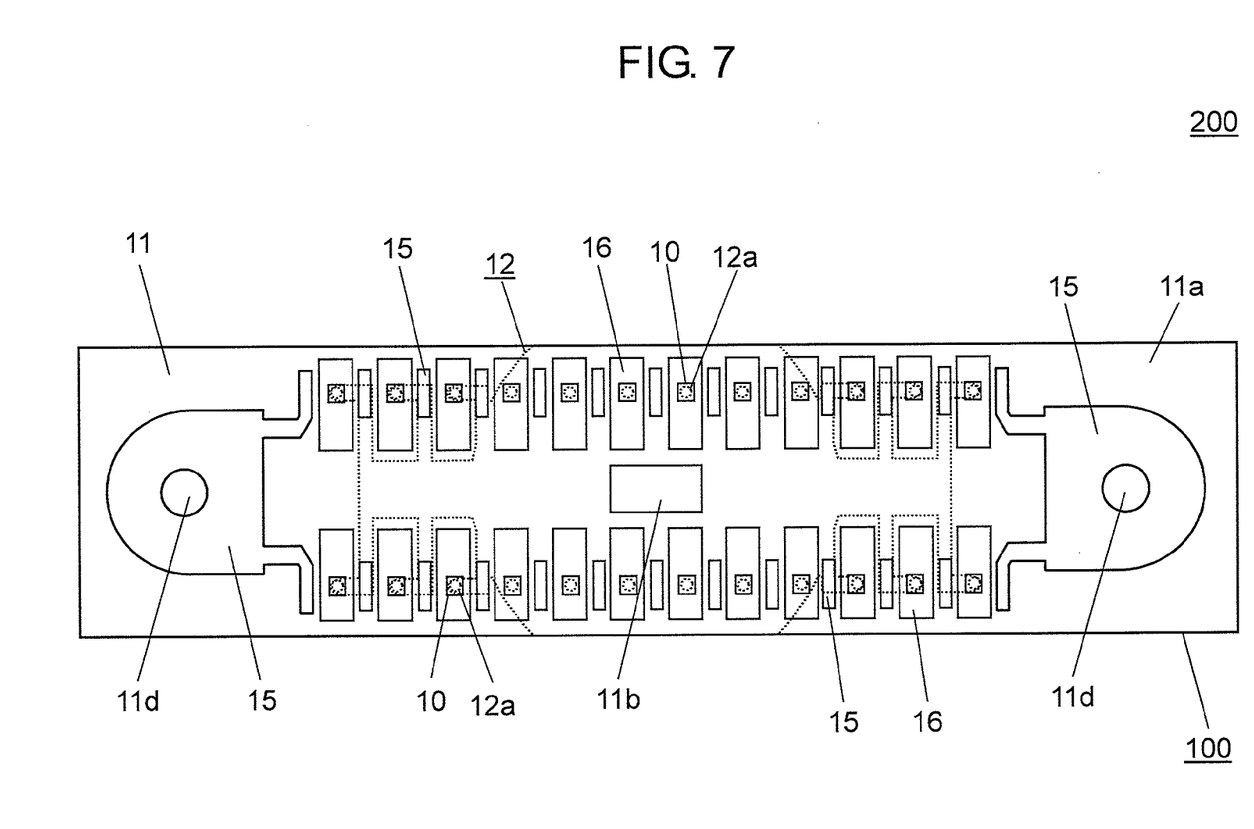
FIG. 7 is a top view illustrating a schematic configuration of the LED module according to the exemplary embodiment.
Figure 8:
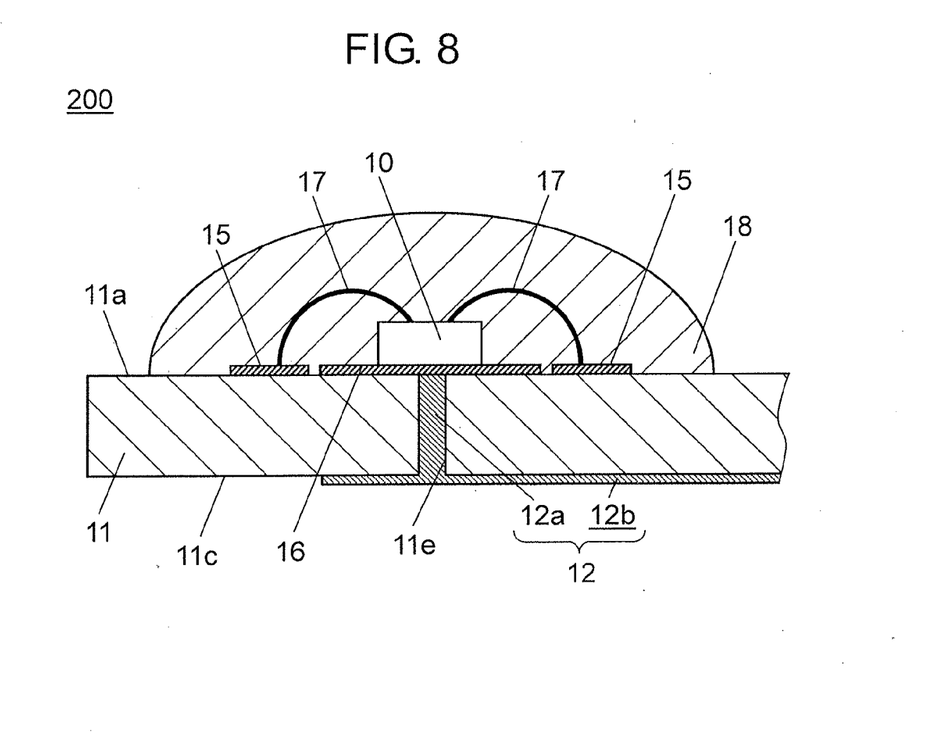
FIG. 8 is a partial cross-sectional view illustrating the LED module according to the exemplary embodiment.

The following section will describe an LED substrate according to a second exemplary embodiment of the present invention and an LED module having the LED substrate, and an LED light bulb including the LED substrate and the LED module using FIG. 6 to FIG. 8.

FIG. 6 is a bottom view illustrating the schematic configuration of an LED module according to a second exemplary embodiment of the present invention. FIG. 7 is a top view illustrating the schematic configuration of the LED module according to the exemplary embodiment. FIG. 8 is a partial cross-sectional view illustrating the LED module according to the exemplary.

The exemplary embodiment is different from the first exemplary embodiment in the configuration of heat dissipation path 12. Other configurations and operations are the same as the first exemplary embodiment and thus will not be described further. The same parts as those described in the first exemplary embodiment will be described with the same reference numerals.

Specifically, as shown in FIG. 8, LED substrate 100 of the exemplary embodiment includes cylindrical through hole 11e. Through hole 11e is filled with paste material such as copper, silver, or silver solder material for example to thereby provide heat transfer path section 12a. Cylindrical through hole 11e is formed by a drill for example.

As shown in FIG. 6, heat dissipation pattern section 12b connected to heat transfer path section 12a is composed of: connecting sections 12c; and patterns 12d provided at both sides of connecting section 12c. Heat transfer path section 12a have the same shape as that of tip end face 13a of heat dissipation support member 13 described in FIG. 3 and are entirely superimposed. Patterns 12d have a fishbone chart-like shape for example.

Then, as shown in FIG. 6, pattern 12d constituting heat dissipation pattern sections 12b at both sides of heat dissipation path 12 is basically formed between fluorescent substance layer 16 and fluorescent substance layer 16 adjacent to each other.

Heat dissipation pattern section 12b of heat dissipation path 12 is formed so as to be continued with heat transfer path section 12a from the long side of fluorescent substance layer 16.

Since fluorescent substance layer 16 has an oblong shape, distance W between the long side of fluorescent substance layer 16 and LED chip 10 is shorter than distance L between the short side of fluorescent substance layer 16 and LED chip 10.

Thus, pattern 12d of heat dissipation pattern section 12b is formed so as to have the shortest distance to heat transfer path sections 12a of heat dissipation path 12, respectively. As a result, heat dissipation pattern section 12b (pattern 12d) traversing fluorescent substance layer 16 can have a reduced area.

Specifically, pattern 12d of heat dissipation pattern section 12b is provided to be opposed to fluorescent substance layer 16 at positions other than connecting section 12c in the minimum required range (area) via substrate body 11. As a result, the amount of light emitted to back face 11c side of substrate body can be further reduced via fluorescent substance layer 16 partially blocked by heat dissipation pattern section 12b. As a result, an LED module having a higher light emission amount and an LED light bulb having the LED module can be realized.

As shown in FIG. 8, fluorescent substance layer 16 of the LED substrate 100 has thereon LED chip 10 to connect LED chip 10 and wiring section 15 of LED substrate 100 via metal thin wire 17. Translucent resin 18 including fluorescent substance is used to seal LED chip 10 and metal thin wire 17. As a result, LED module 200 of the exemplary embodiment is configured.

Furthermore, engagement hole 11b of substrate body 11 of LED module 200 is inserted with projection 13b provided on tip end face 13a of heat dissipation support member 13 shown in FIG. 4A and FIG. 4B. As a result, tip end face 13a of heat dissipation support member 13 is connected while being superimposed of heat dissipation pattern section 12b at the center of heat dissipation path 12 (i.e., connecting section 12c).

As shown in FIG. 5, LED module 200 supported by heat dissipation support member 13 is included in globe 19, thereby constituting LED light bulb 300.

According to the exemplary embodiment, as described in the first exemplary embodiment, the heat generated by the light emission from LED chip 10 is transferred from heat transfer path section 12a of heat dissipation path 12 to heat dissipation pattern section 12b and is dissipated via heat dissipation pattern section 12b. Furthermore, the generated heat is transferred to heat dissipation support member 13 connected to connecting section 12c of heat dissipation pattern section 12*b* and is also dissipated via heat dissipation support member 13. Thus, the heat generated by light emission is prevented from being accumulated in LED chip 10. Since the entire face of connecting section 12*c* of heat dissipation pattern section 12*b* is connected to tip end face 13*a* of heat dissipation support member 13, the heat generated in LED chip 10 can be efficiently transferred to heat dissipation support member 13.

In the exemplary embodiment, only one cylindrical through hole 11*e* has been described as being formed to LED chip 10. However, the invention is not limited to this. For example, a plurality of through holes may be formed to form heat transfer path section 12*a* of heat dissipation path 12 so long as at least the shape of LED chip 10 can be maintained. Thus, in the case of a machining method by which only a small hole can be opened for example, a plurality of through holes having a small diameter can be opened and can be filled with conductive material, thereby forming heat transfer path section 12*a*. As a result, heat dissipation path 12 can have an increased area by the heat transfer path section 12*a*, thus effectively dissipating the heat generated from LED chip 10.

The present invention is not limited to the respective exemplary embodiments and can be subjected to various modifications.

Specifically, heat dissipation pattern section 12*b* of heat dissipation path 12 shown in FIG. 1 and FIG. 6 are an example and various other patterns are possible. For example, heat dissipation pattern section shown in FIG. 1 may be combined with heat dissipation pattern section 12*b* shown in FIG. 6.

In the first exemplary embodiment, an example has been described in which substrate body 11 includes groove 11*f* and groove 11*f* is filled with heat dissipation pattern section 12*b* of heat dissipation path 12. However, the invention is not limited to this. When there is small heat to be dissipated, a configuration of the second exemplary embodiment as shown in FIG. 8 for example may be used in which back face 11*c* of substrate body 11 is coated with copper, silver, or silver solder material, thus providing improved productivity for example.

The respective exemplary embodiments have been described by way of example of substrate body 11 of LED substrate 100 configured by glass. However, the invention is not limited to this. When an objective improved heat dissipation is required, substrate body 11 may be formed by material other than glass (e.g., translucent ceramic). In this case, such material is preferably selected that has a higher thermal conductivity than that of LED substrate 100 of substrate body 11.

In the respective exemplary embodiments, LED light bulb 300 has been illustratively described that includes heat dissipation support member 13 for supporting LED substrate 100 and LED module 200. However, the invention is not limited to this. Another configuration not including heat dissipation support member 13 may be used. In this case, a part of LED substrate 100 supported by heat dissipation support member 13 in particular does not require to include heat dissipation pattern section 12*b* of heat dissipation path 12.

The respective exemplary embodiments have been described by way of example of LED module 200 including fluorescent substance layer 16. However, the invention is limited to this. Another configuration may be used that does not include fluorescent substance layer 16. This can consequently simplify the configuration and can allow the heat generated in LED chip 10 to be effectively transferred by substrate body 11 for heat dissipation.

As described above, the LED substrate of the present invention includes: a translucent substrate body in which an LED chip is disposed on a front face; and a heat dissipation path provided in the substrate body to dissipate heat generated in the LED chip. The substrate body includes a through hole that penetrates through the substrate body from the front face on which the LED chip is provided to a back face. The heat dissipation path includes: a heat transfer path section provided in the through hole; and a heat dissipation pattern section provided on the back face of the substrate body, and connected to the heat transfer path section.

According to this configuration, the heat generated in the LED chip can be transferred from the heat transfer path section of the heat dissipation path to the heat dissipation pattern section and can be dissipated, thus preventing the LED chip from being excessively heated.

Furthermore, according to the LED substrate of the present invention, a plurality of LED chips provided in the substrate body may have a plurality of corresponding heat transfer path sections provided in a plurality of through holes. The heat transfer path sections may be connected with the heat dissipation pattern section having a grid or ladder-like pattern.

According to this configuration, when a plurality of LED chips are provided, the heat transfer path section of the heat dissipation path is provided for each LED chip to connect each heat transfer path section to a heat dissipation pattern section. As a result, the heat generated in the plurality of LED chips can be transferred from the connected heat transfer path section to the heat dissipation pattern section and can be dissipated. As a result, the LED chip can be effectively suppressed from being excessively heated.

According to the LED substrate of the present invention, the through hole may be formed to have a funnel shape of which a back face side has an increased diameter than a front face side of the substrate body.

According to this configuration, the through hole may be formed to have a funnel shape (e.g., frustum shape or truncated pyramid shape). The through hole includes a heat transfer path section. As a result, when compared with a cylindrical heat transfer path section, the heat transfer path section can be increased, thus providing improved heat dissipation. Furthermore, the heat transfer path section and the substrate body can have therebetween an increased contact area and the heat transfer path section can be set in a wedge-like manner. As a result, the heat transfer path section can be closely attached to the substrate body, thus providing improved reliability.

According to the LED substrate of the present invention, the back face side of the substrate body may have a groove and the heat dissipation pattern section may be provided in the groove.

According to this configuration, the heat dissipation pattern section can be formed in the groove by filling for example. As a result, the heat dissipation pattern section can be more closely attached to the substrate body of the LED substrate, thus providing improved reliability. Furthermore, the heat dissipation pattern section can have an increased cross-sectional area when compared with a case where the heat dissipation pattern section is formed to have a thin thickness in the back face of the substrate body, thus providing further-improved heat dissipation.

According to the LED substrate of the present invention, the back face of the substrate body may have a connecting section connected to the heat dissipation support member.

By the above configuration, when the connecting section is connected to the heat dissipation support member to configure an LED light bulb, the heat generated in the LED chip is sent from the heat transfer path section of the heat dissipation path via the heat dissipation pattern section and is dissipated from the heat dissipation support member to a member of the LED light bulb (e.g., bayonet cap). As a result, the heat generated in the LED chip can be effectively dissipated to the exterior.

According to the LED substrate of the present invention, a position on the front face of the substrate body on which the LED chip is provided further includes a fluorescent substance layer. The heat dissipation pattern section of the heat dissipation path is provided to be opposed to the fluorescent substance layer via the substrate body.

According to this configuration, even when the heat dissipation pattern section of the heat dissipation path blocks light emitted from the back face of the LED chip, the light emission is not hindered by the heat dissipation pattern section of the heat dissipation path. Specifically, the heat dissipation pattern section of the heat dissipation path is opposed to the fluorescent substance layer to sandwich the substrate body. Thus, the light emitted from the back face of the LED chip can be emitted from the back face of the substrate body in a desired light amount.

The LED module of the present invention may include: the LED substrate; an LED chip provided to a fluorescent substance layer of the LED substrate; and translucent resin including fluorescent substance for sealing the LED chip.

According to this configuration, by the light emission from the LED chip provided on the LED substrate, the heat generated from the LED chip can be transferred through the heat dissipation path and can be dissipated. Thus, an LED module can be realized that can suppress an LED chip from being excessively heated.

The LED light bulb of the present invention may be included the LED module connected to a heat dissipation support member and may be enclosed in a globe.

According to this configuration, an LED module is provided in which even light-emitting LED chip is prevented from being excessively heated. As a result, a long-life and reliable LED light bulb can be realized.

INDUSTRIAL APPLICABILITY

According to the present invention, an LED substrate and an LED module having a superior heat dissipation characteristic can be effectively used as a part constituting an LED light bulb. Thus, the invention is useful, for example, in the field of an LED light bulb favorably used as a substitute light source of an incandescent light bulb for which low cost and high reliability are desired.

REFERENCE MARKS IN THE DRAWINGS

1 Substrate
1a Concave section
1b and 11e Through hole
2 and 10 LED chip
3 Installation pattern
4 Resin
5 Wiring pattern
6 and 17 Metal thin wire
7 and 12c Connecting section
8 Heat dissipation pattern
10a and 11c Back face
10b and 11a Front face
11 Substrate body
11b Engagement hole
11d Connection hole
11f Groove
11g and 11h Side edge
12 Heat dissipation path
12a Heat transfer path section
12b Heat dissipation pattern section
12b1 Short side line
12b2 Long side line
12b3 Centerline
12d Pattern
13 Heat dissipation support member
13a Tip end face
13c Both side edges
13b Projection
13d Both ends
14 Lead wire
15 Wiring section
16 Fluorescent substance layer
16a Short side section
18 Translucent resin
19 Globe
20 Bayonet cap
100 LED substrate
200 LED module
300 LED light bulb

The invention claimed is:

1. An LED substrate comprising:
a translucent substrate body in which an LED chip is disposed on a front face; and
a heat dissipation path provided in the substrate body to dissipate heat generated in the LED chip,
wherein the substrate body includes a through hole that penetrates through the substrate body from the front face on which the LED chip is provided to a back face,
wherein the heat dissipation path includes
a heat transfer path section provided in the through hole, and
a heat dissipation pattern section provided on the back face of the substrate body, and connected to the heat transfer path section, and
wherein the substrate body has a plurality of the heat transfer path sections provided in a plurality of the through holes to correspond to a plurality of the LED chips provided, and
the heat dissipation pattern section having a grid or ladder-like pattern connects the heat transfer path sections.

2. The LED substrate according to claim 1, wherein the through hole is formed to have a funnel shape of which a back face side has an increased diameter than the front face side of the substrate body.

3. The LED substrate according to claim 1, wherein
the back face side of the substrate body has a groove, and
the heat dissipation pattern section is provided in the groove.

4. The LED substrate according to claim 1, wherein the back face of the substrate body has a connecting section connected to a heat dissipation support member.

5. The LED substrate according to claim 1, wherein
a fluorescent substance layer is further included at a position on the front face of the substrate body at which the LED chip is provided, and
the heat dissipation pattern section of the heat dissipation path is provided to be opposed to the fluorescent substance layer via the substrate body.

6. An LED module comprising:
the LED substrate according to claim 1 and an LED chip provided to a fluorescent substance layer of the LED substrate, and
translucent resin including fluorescent substance for sealing the LED chip.

7. An LED light bulb comprising the LED module of claim 6 connected to a heat dissipation support member and enclosed in a globe.

8. The LED substrate according to claim 1, wherein the heat dissipation pattern section has a shape comprising a first plurality of lines extending between respective heat transfer path sections, and a second plurality of lines intersecting the first plurality of lines.

9. The LED substrate according to claim 8, wherein
the first plurality of lines includes a short side line that connects a heat transfer path section at one side edge of the substrate body to a respective heat transfer path section at another side edge of the substrate body, and
the second plurality of lines includes a centerline that intersects a center of the short side line, the centerline formed in an area spaced from a center of the substrate body and ends of the substrate body.

\* \* \* \* \*